United States Patent [19]

Ikoma et al.

[11] 4,068,092

[45] Jan. 10, 1978

[54] VOICE CONTROL CIRCUIT

[75] Inventors: Kazuo Ikoma; Hidetomo Takeda; Tadashi Kudou; Shigeya Kuriki, all of Tokyo, Japan

[73] Assignee: Oki Electric Industry Co., Ltd., Tokyo, Japan

[21] Appl. No.: 615,705

[22] Filed: Sept. 22, 1975

[30] Foreign Application Priority Data

Nov. 8, 1974 Japan .............................. 49-128104

[51] Int. Cl.² ............................................. H03G 3/30
[52] U.S. Cl. .................................. 179/1 VL; 179/1 P; 179/1 VC
[58] Field of Search ................. 179/1 P, 1 VC, 1 HF, 179/1 VL

[56] References Cited

U.S. PATENT DOCUMENTS

| 2,321,986 | 6/1943 | Brown | 179/1 P |
| 2,409,977 | 10/1946 | Fisher | 179/1 P |
| 2,761,897 | 9/1956 | Jones | 179/1 VC |
| 3,286,031 | 11/1966 | Geddes | 179/1 VC |
| 3,448,215 | 6/1969 | Engel | 179/1 VC |
| 3,700,811 | 10/1972 | Davidson | 179/1 D |
| 3,712,959 | 1/1973 | Farrello | 179/1 VC |
| 3,751,602 | 8/1973 | Breeden | 179/1 HF |

*Primary Examiner*—Kathleen H. Claffy
*Assistant Examiner*—E. S. Kemeny
*Attorney, Agent, or Firm*—Wenderoth, Lind & Ponack

[57] ABSTRACT

In a voice control circuit comprising a variable loss circuit and a voice level detector which is connected to control the variable loss circuit, there is provided a noise control circuit. The noise control circuit comprises a timer which discriminates as noise an input having a constant amplitude and persisting for greater than a greater than a predetermined interval, a noise level detector and a variable attenuator connected on the input side of the voice level detector and which functions to attenuate the voice signal in accordance with the detected level of the noise.

1 Claim, 8 Drawing Figures

(a)

(b)

PRIOR ART

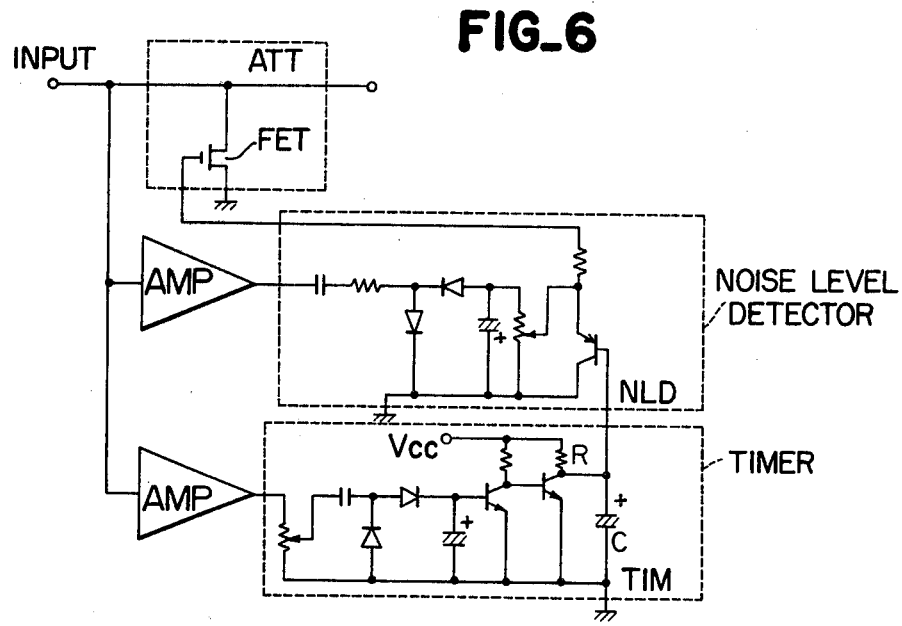
FIG_6
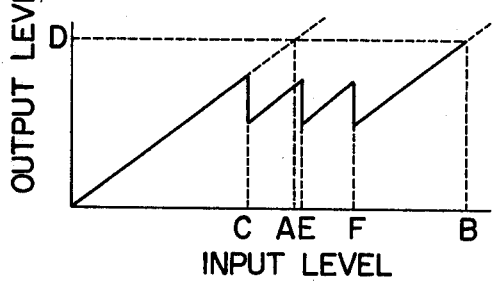
FIG_7
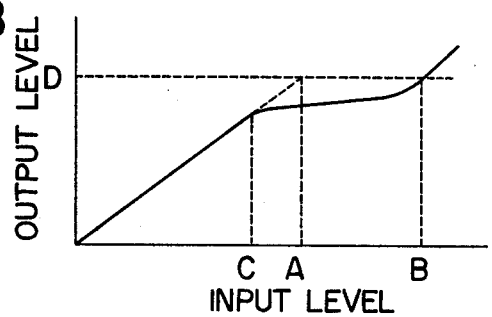
FIG_8

VOICE CONTROL CIRCUIT

BACKGROUND OF THE INVENTION this invention relates to a voice control system wherein the presence of a noise component received concurrently with a voice signal is detected for determining the S/N ratio thereby the circuit condition of a telephone or other communication system.

In a prior art hand free telephone set utilizing a voice control circuit, the switching between voice transmitting and receiving states is effected by detecting the presence of a received voice signal. Generally, however, since noise components such as peripheral noise and line noise are also received together with the voice signal, misoperation of the voice control circuit has been inevitable.

To eliminate the noise components various solutions have been proposed including a method of utilizing a directive microphone which utilizes the directivity of voice, and a method in which a plurality of microphones are used to detect the difference in the input signals to the microphones for eliminating the peripheral noise by utilizing acoustic coupling. Further, according to an electrical method, filters are used to eliminate the noise components for discriminating the voice input from the noise input thus elevating the switching level of the voice input. However, a simple and effective method has not been proposed. More particularly, in the acoustic method highly trained skill is necessary whereas in the electrical method the level at which the commencement of the voice is detected is limited so that the differences in personal ability results in instability of operation and delay in switching time. As a result, smooth operation was not obtained.

Such methods of solving the problem are not effective because they involve difficult engineering problems and are expensive.

SUMMARY OF THE INVENTION

It is therefore an object of this invention to provide an improved system of eliminating misoperation caused by noise.

Another object of this invention is to provide a voice control system for telephone systems and other communication systems including a novel system of eliminating misoperation caused by noise.

Noises are generally classified into two types, that is noise which varies instantaneously and so-called steady noise having a constant amplitude and which sustains continuously. Especially, the latter affects communication. As shown in FIG. 1, the wave form of a voice signal includes a recurrence of steeply varying amplitude whereas the steady noise continues with substantially constant amplitude as shown in FIG. 1b.

It is a feature of this invention to utilize such difference in the characteristics of the voice signal and noise for controlling or eliminating the noise component.

According to this invention, there is provided a voice control circuit wherein the presence of an input voice signal is detected for changing the circuit condition. There is provided a circuit which includes means which discriminates as noise the input signal having a constant amplitude and persisting for greater than a predetermined interval thereby detecting the presence of noise applied concurrently with a voice signal, a circuit for detecting the level of the input noise, and a circuit for variably attenuating the input signal in proportion to the detected level of the noise, thereby imparting an attenuation to the voice control circuit at a value proportional to the level of the input signal varying the threshold value at which said voice control circuit operates thus preventing misoperation of the circuit caused by a noise component.

BRIEF DESCRIPTION OF THE DRAWINGS

Further objects and advantages of the invention can be more fully understood from the following detailed description taken in conjunction with the accompanying drawings in which:

FIGS. 5 and 6 show detailed circuit construction of two types of variable attenuators used in the circuit shown in FIG. 4; and FIGS. 7 and 8 show characteristics of the circuits shown in FIGS. 5 and 6, respectively.

DESCRIPTION OF THE PREFERRED EMBODIMENTS

To have better understanding of the invention a typical prior art voice control system will firstly be described with reference to FIG. 2 in which a voice signal from a microphone M is voltage amplified by a microphone amplifier MA and the output thereof is applied to a voice level detecting circuit TDC via an amplifier $AMP_1$. The voice level detecting circuit TDC is preset to a predetermined switching level or a threshold value so that when it detects the presence of a voice input having a level above the threshold value the output thereof opens a vario-losser circuit TVL whereby the voice signal is sent to the line via the vario-losser circuit TVL and a transmission amplifier TA.

Figure 3:
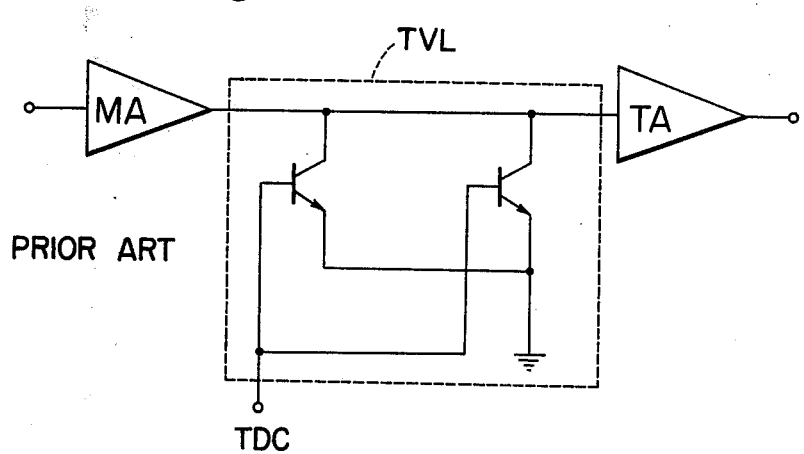
FIG. 3 shows a connection diagram of the vario-losser circuit TVL shown in FIG. 2.

The amplifier $AMP_1$, voice level detecting circuit TDC and vario-losser circuit TVL constitute a voice control circuit TCC. FIG. 3 shows one example of the vario-losser circuit TVL. As shown, the vario-losser circuit TVL comprises a pair of parallel connected transistors with their base electrodes connected to the output of the voice level detecting circuit TDC.

Where a noise component having a level above the threshold value of the voice level detecting circuit TDC is applied by the microphone M instead of the voice signal the voice level detecting circuit TDC will open the vario-losser circuit TVL in the same manner as the voice signal so that there is a defect in that the noise component is sent to the line.

As has been pointed out hereinabove, according to this invention such misoperation of the circuit caused by the noise component is prevented by utilizing the difference in the characteristics of the voice signal and that of noise.

Figure 2:
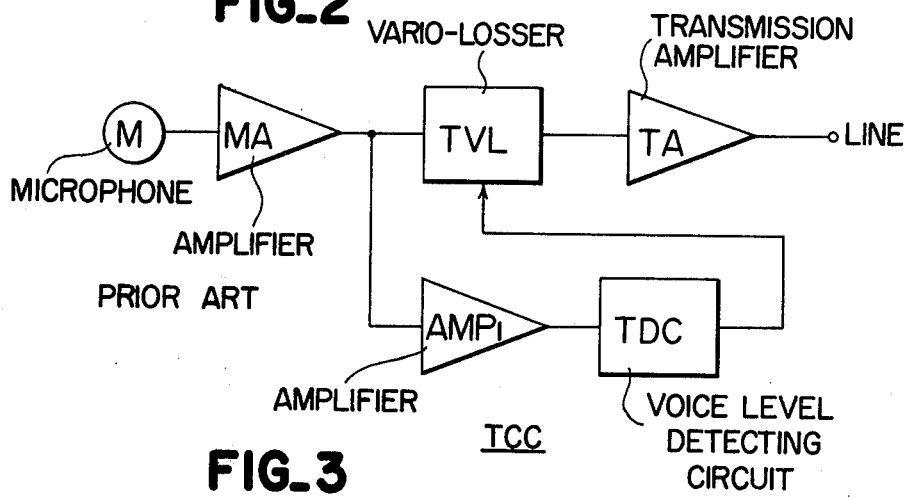
FIG. 2 is a block diagram showing one example of the prior art voice control system.
Figure 4:
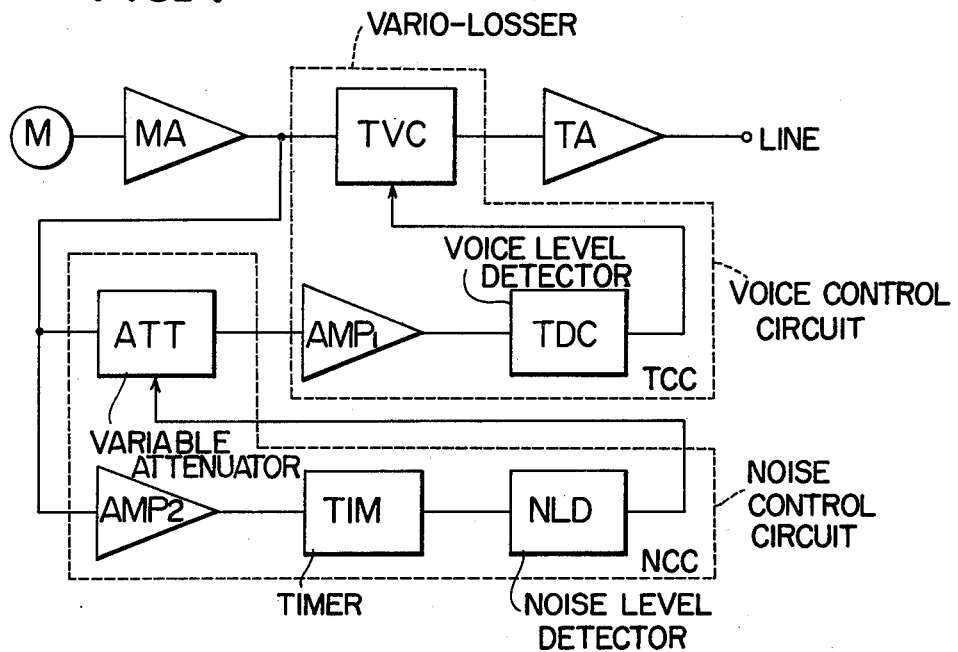
FIG. 4 is a block diagram showing one embodiment of the novel voice control system embodying the invention.

According to this invention, as shown in FIG. 4, to the voice control circuit TCC which is identical to that shown in FIG. 2 is added a noise control circuit NCC including a timer circuit TIM which identifies an input signal having a definite amplitude and persisting for greater than a predetermined interval as noise, a noise level detector NLD which detects the level of the noise, a variable attenuator ATT controlled by the output from the noise level detector NLD for varying the degree of attenuation in accordance with the detected level of the noise, and an amplifier $AMP_2$ connected between the output of the microphone amplifier MA and input of the timer TIM. The variable attenuator ATT is connected between the output of the microphone amplifier MA and the amplifier $AMP_1$ of the voice control circuit TCC.

With this connection, the noise from the microphone M causes the noise control circuit NCC to operate in the same manner as has been described in connection with FIG. 2. Suppose now that the level of the noise input is higher than the threshold level of the voice level detector TDC thus causing it to operate.

Under these conditions, the timer TIM operates to discriminate between whether the input signal from the microphone M comprises a voice signal or a noise signal and when it determines that the input signal is noise, the noise level detector NLD will apply a control signal to the variable attenuator ATT corresponding to the input level. In response to the control signal from the noise level detector, the variable attenuator ATT decreases the level of the input signal or the noise signal below the threshold value of the voice level detector TDC thereby preventing the misoperation thereof caused by the noise component. When a noise component having a higher level is applied, since the degree of attenuation provided by the variable attentuator ATT is increased proportionally, the level of the noise input is maintained always below the threshold value of the voice level detector TDC.

Figure 1:
FIGS. 1a and 1b show typical wave forms of a voice signal and steady noise, respectively.
Figure 1:

As described above, where a noise signal having a high level is applies from the microphone M, the voice level detector TDC stops its operation so that the vario-losser circuit TVC is not opened with the result that the noise signal is not transmitted to the line thus preventing misoperation of the voice control circuit.

Where the input from the microphone comprises a voice signal having a level higher than the threshold value of the voice level detector TDC thus operating the same, then the timer TIM of the noise control circuit NCC identifies that the input signal is a voice signal based on the wave form shown in FIG. 1a. As a result, although the noise level detector NLD provides a control signal to the variable attenuator ATT, in this case the degree of attenuation is not varied.

Accordingly, the voice level detector TDC continues its operation according to the input signal from the microphone so as to open the vario-losser circuit TVC whereby the voice signal from the microphone is sent to the line.

The invention will be described in more detail with reference to FIGS. 5 and 6 which show examples of the noise control circuit embodying the invention and FIGS. 7 and 8 which show the characteristics of the circuits shown in FIGS. 5 and 6, respectively.

Figure 5:
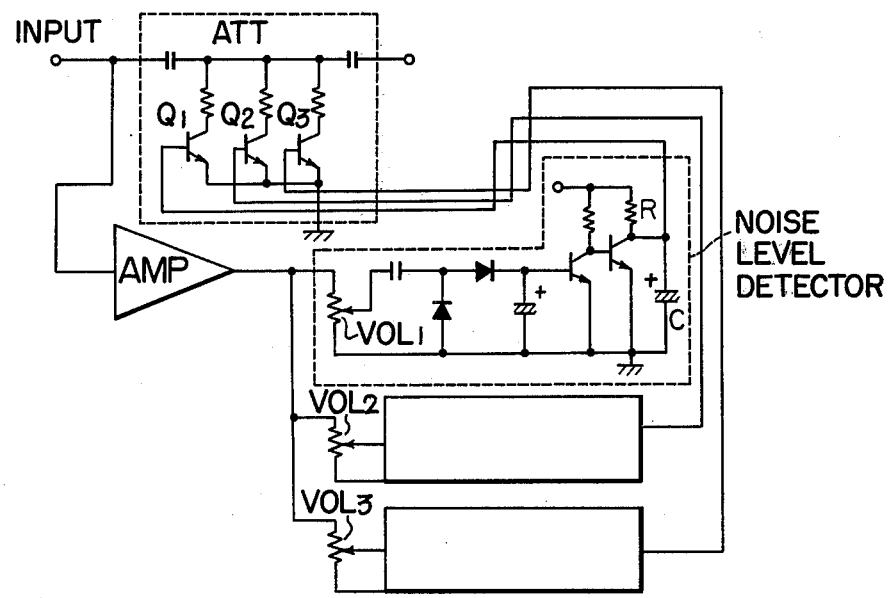

Referring firstly to FIG. 5, the noise control circuit shown therein comprises a group of transistor switches $Q_1$, $Q_2$ and $Q_3$ which constitute a variable attenuation circuit. In this case, the noise level has three stages. More particularly, the operating points of the noise detector NDC comprising a noise level detector (corresponding to the noise level detector NLD shown in FIG. 4) and a timer (corresponding to the timer TIM shown in FIG. 4) are set by variable resistors $VOL_1$, $VOL_2$ and $VOL_3$ which detect the noise level and the timer functions to operated the noise detector NDC when the input noise continues more than 3 or 4 seconds for operating transistor switch group $Q_1$, $Q_2$ and $Q_3$ thereby applying stepwisely varying attenutation. The desired attenuation is determined by an RC time constant circuit, the principal time determining components of which are shown as R and C in FIG. 5 and FIG. 6.

FIG. 7 shows an input-output characteristic of said variable attenuation circuit ATT in which the threshold value of the voice level detector TDC is set at a point D so that so long as the noise is small and the noise control circuit NCC does not operate, the voice level detector TDC will operate at a level A. However, when the noise increases stepwisely as shown by points C, E and F, the noise control circuit NCC is operated by automatically varying the switching level by the difference in the input levels shown by points B and C by the action of the variable attenuation circuit, thereby preventing the misoperation of the voice level detector caused by the noise signal.

In the modification shown in FIG. 6 a field effect transistor switch FET is used to constitute the variable attenuation circuit ATT of the noise control circuit NCC. In this case, the VGS-ID characteristic of the field effect transistor switch FET is used to apply an attenuation to the variable attenuation circuit ATT which is proportional to the noise level. More particularly, the noise level detector NLD functions to rectify the input signal wave to produce a DC voltage. When the input signal wave having a definite amplitude persists for longer than a predetermined interval as shown in FIG. 1b, the time TIM operates to apply the rectified DC voltage upon the gate electrode of the field effect transistor switch FET of the variable attenuation circuit from the noise level detector NLD. Whereupon the field effect transistor switch FET Imparts an attenuation to the variable attenuation circuit ATT of the amount proportional to the input signal or the level of the noise input signal thereby preventing misoperation of the voice level detector TDC caused by the noise signal.

FIG. 8 shows the input-output characteristic of the variable attenuation circuit ATT comprising the field effect transistor switch FET in which point D shows a point at which the threshold value of the voice level detector TDC is set and point A shows the operating point of the voice level detector TDC when the noise control circuit NCC does not operate. Point C shows an input level at which the noise control circuit NCC is set to operate. Under these conditions, the noise control circuit NCC will not operate until the level of noise increases to point B.

Considering now a case wherein the input signal from the microphone M comprises a voice signal superposed upon a noise signal. In this case as the threshold value of the voice level detector increases in proportion to the level of the noise component one may consider that the operation of the voice level detector will become difficult. However, the invention is based on the unique utilization of the human habit that the man increases its voice level in proportion to the level of the surrounding noise when he speaks in a noisy circumstance. Accordingly, even when the surrounding noise is detected and hence the threshold value of the voice level detector is increased, there is no appreciable difficulty for communication.

As has been described hereinabove, according to this invention it is possible to use a handfree telephone set without any error in such noisy places as airports or places where air conditioning apparatus is installed where noises are generated continuously.

Further, as can be understood from the foregoing description, the invention is applicable not only to handfree telephone sets but also communication systems in general utilizing a voice frequency band.

What is claimed is:

1. In a voice control circuit of the type comprising a variolosser circuit connected in series with a signal line, and a voice level detecting circuit responsive to the presence of a voice signal having a level above a predetermined threshold value for operating said variolosser circuit, the improvement which comprises a noise control circuit connected on the input side of said voice level detecting circuit, said noise control circuit including a timer which determines as noise the input signal having a constant amplitude and persisting for greater than a predetermined interval thereby detecting the presence of the noise applied to said signal line concurrently with the voice signal, a noise level detector connected to the output of said timer, and a variable attenuator connected on the input side of said voice level detecting circuit and constituted by a plurality of transistor switches controlled by the output from said noise level detector thereby attenuating a signal to said voice level detecting circuit at a value proportional to the level of the input signal, said noise control circuit further comprising a plurality of sets of a timer and a noise level detector, said sets having different operating points and being respectively connected to said plurality of transistor switches, thus producing stepwisely varying attenuation.

* * * * *